United States Patent [19]

Tamamura

[11] Patent Number: 4,733,167
[45] Date of Patent: Mar. 22, 1988

[54] MEASUREMENT CIRCUIT FOR DIGITAL TO ANALOG CONVERTER

[75] Inventor: Toshio Tamamura, Hachioji, Japan

[73] Assignee: Hewlett-Packard Company, Palo Alto, Calif.

[21] Appl. No.: 829,363

[22] Filed: Feb. 13, 1986

[30] Foreign Application Priority Data

Feb. 14, 1985 [JP] Japan ................................ 60-26730

[51] Int. Cl.$^4$ ............................................. G01R 19/25
[52] U.S. Cl. .................................... 324/73 R; 371/27
[58] Field of Search ............. 324/73 R; 307/262, 352; 328/55, 151, 155

[56] References Cited

U.S. PATENT DOCUMENTS

| | | | |
|---|---|---|---|
| 3,718,910 | 2/1973 | Scray, Jr. et al. | 324/73 R |
| 3,872,441 | 3/1975 | Cailow | 324/73 R |
| 4,092,589 | 5/1978 | Chou et al. | 324/73 R |
| 4,332,028 | 5/1982 | Joccotton et al. | 324/73 R |
| 4,497,056 | 1/1985 | Sugamori | 324/73 R |

FOREIGN PATENT DOCUMENTS

| | | | |
|---|---|---|---|
| 0144763 | 8/1983 | Japan | 324/73 R |
| 1278694 | 6/1972 | United Kingdom | 324/73 R |

OTHER PUBLICATIONS

"Digital Phase Shifters", by Paterson, The Marconi Review, 3rd Quarter 1973, pp. 193-199.
"Troubleshooting Large-Scale Integrated Circuit Units", by Howe et al, IBM Tech. Disc. Bull, vol. 17, #7, 12/74, pp. 1941-1944.
"Testing Digital-to-Analog Converters", by Beaven, IBM Tech. Disc. Bull., vol. 24, #1A, 6/81, pp. 224-225.

Primary Examiner—Reinhard J. Eisenzopf
Assistant Examiner—W. Burns
Attorney, Agent, or Firm—James M. Williams

[57] ABSTRACT

A device for evaluating the accuracy and dynamic response of a digital to analog converter (DAC). A digital word generator which provides inputs to the DAC and a sampler which samples the analog output signal from the DAC are triggered by a stream of clock pulses. Clock pulses for the sampler pass through a fixed delay line, to provide time for the DAC to stabilize. Clock pulese for the digital word generator pass through a pulse swallower capable of eliminating clock pulses to phase shift the digital word input to the DAC one step with respect to the sampler trigger signal, to move the sampling point to the next step in the cycle of the digital input waveform.

4 Claims, 4 Drawing Figures

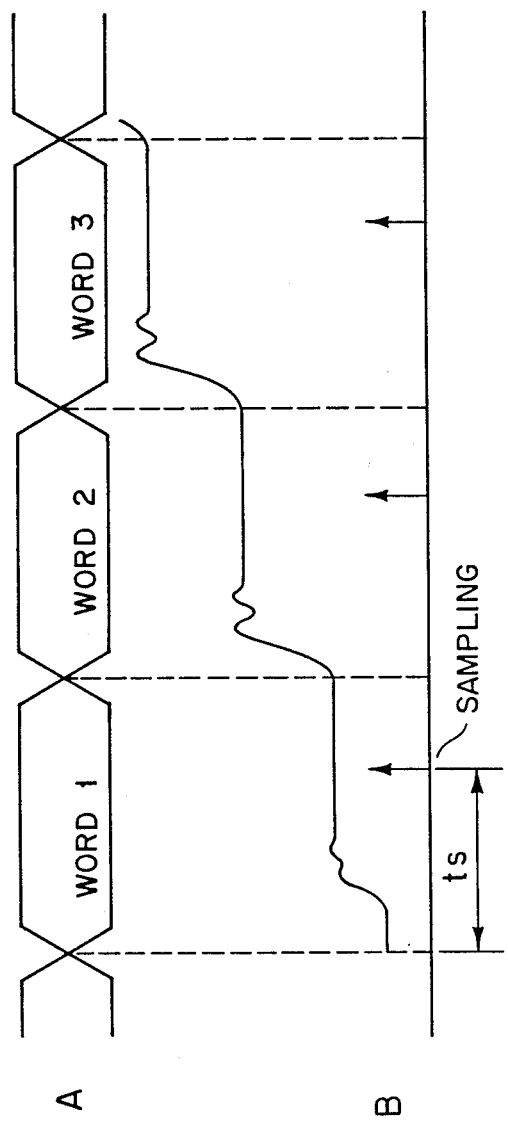
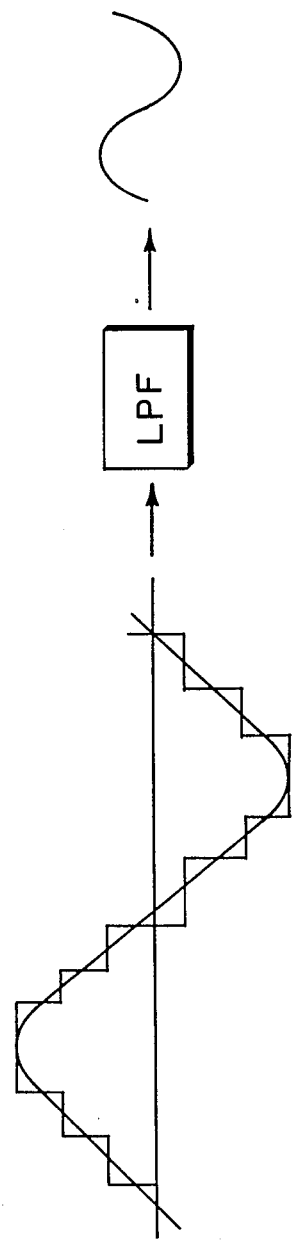
FIG 3 (PRIOR ART)
FIG 4 (PRIOR ART)

MEASUREMENT CIRCUIT FOR DIGITAL TO ANALOG CONVERTER

BACKGROUND OF THE INVENTION

This invention generally relates to a measurement circuit for the evaluation of a Digital to Analog Converter (DAC). More particularly, this invention relates to a dynamic measurement circuit for a DAC.

DACs produce analog output signals which correspond to digital input words. The amplitude of the output signal of the DAC must accurately correspond to the input digital word. Accordingly, the evaluation of the accuracy of a DAC has been important during design, manufacturing or before use of the DAC. The evaluation measurement can be performed by providing digital data words to a DAC under DC conditions and measuring the output signals with a digital voltmeter to obtain its dynamic characteristics. Such evaluation measurements have to date been performed by one of the two methods described below.

FIG. 3 depicts the input and output waveforms characteristic of one measurement circuit for DAC evaluation known in the prior art. Waveform A represents input data words and waveform B represents the output analog signals from the DAC. After delay time ts, which allows the output analog signal to stabilize after the generating input word changes, the output signal is sampled and the sampled value is reconverted to a digital value by an analog-to-digital converter (ADC) using the same conversion scale used in the DAC. The delay time ts can be adjusted, in increments of one nanosecond, by using a programmable delay line, so a number of different points in output analog signals can be sampled.

However, this method is subject to some unavoidable disadvantages. First, to obtain accurate measurements in high speed operation, the sampling and reconversion must be done with accuracy at least comparable to and preferably better than that of the DAC being tested, so that high quality, expensive ADC and sample-and-hold circuits are necessary. Second, a programmable delay line must be used to produce sampling delay time ts. Thus the accuracy and resolution of delay time ts is completely dependant on the performance characteristics of the programmable delay line. This makes it quite difficult to adjust accurately the delay time by increments on the order of 10 nanoseconds. Third, although the delay time ts must be adjusted to suit the characteristics of the DAC under evaluation, the flexibility of this adjustment is also limited by the characteristics of the programmable delay line so that ts cannot be adjusted simply and independently.

FIG. 4 illustrates another method for DAC measurement used in the prior art. In order to obtain output signals from a DAC in the form of a pseudo-sine wave, a corresponding periodic series of digital words is provided as input to the DAC while the DAC operates at a high conversion rate. The staircase output signals are passed through a low pass filter (LPF) for smoothing to produce a sine wave output. The evaluation of the DAC is performed by analyzing the output analog signal as a sine wave, measuring the noise and distortion introduced into the output analog signal.

This method also has some inherent disadvantages. When distortion appears in the output analog signal, it is difficult or impossible to determine the precise failure location with respect to the digital step input. The failures or inaccuracy of the DAC may be obscured by passing the signal through the low pass filter, so that proper evaluation for DAC with its true characteristics cannot always be assured.

BRIEF SUMMARY OF THE INVENTION

The object of the invention is to provide a circuit for making very accurate measurements of the dynamic characteristics of a DAC while the DAC is operated at a high converting rate, and which has readily adjustable sampling points.

According to this invention, the output signals of a DAC are sampled and then reconverted to digital values. The sampling points for the output analog signal of the DAC are adjusted by phase shifting the digital input signal with respect to the triggering signal for sampling, which remains constant. The phase shifting is accomplished by using a pulse swallower to eliminate a clock pulse from the stream of clock pulses which control the digital signal generator to delay the timing of the digital step input words to the DAC.

BRIEF DESCRIPTION OF THE DRAWINGS

FIG. 3 is an illustration of the characteristic input and output waveforms used for a DAC measurement.

FIG. 4 is an illustration of a known DAC measurement technique.

DETAILED DESCRIPTION OF THE PREFERRED EMBODIMENT

Figure 1:
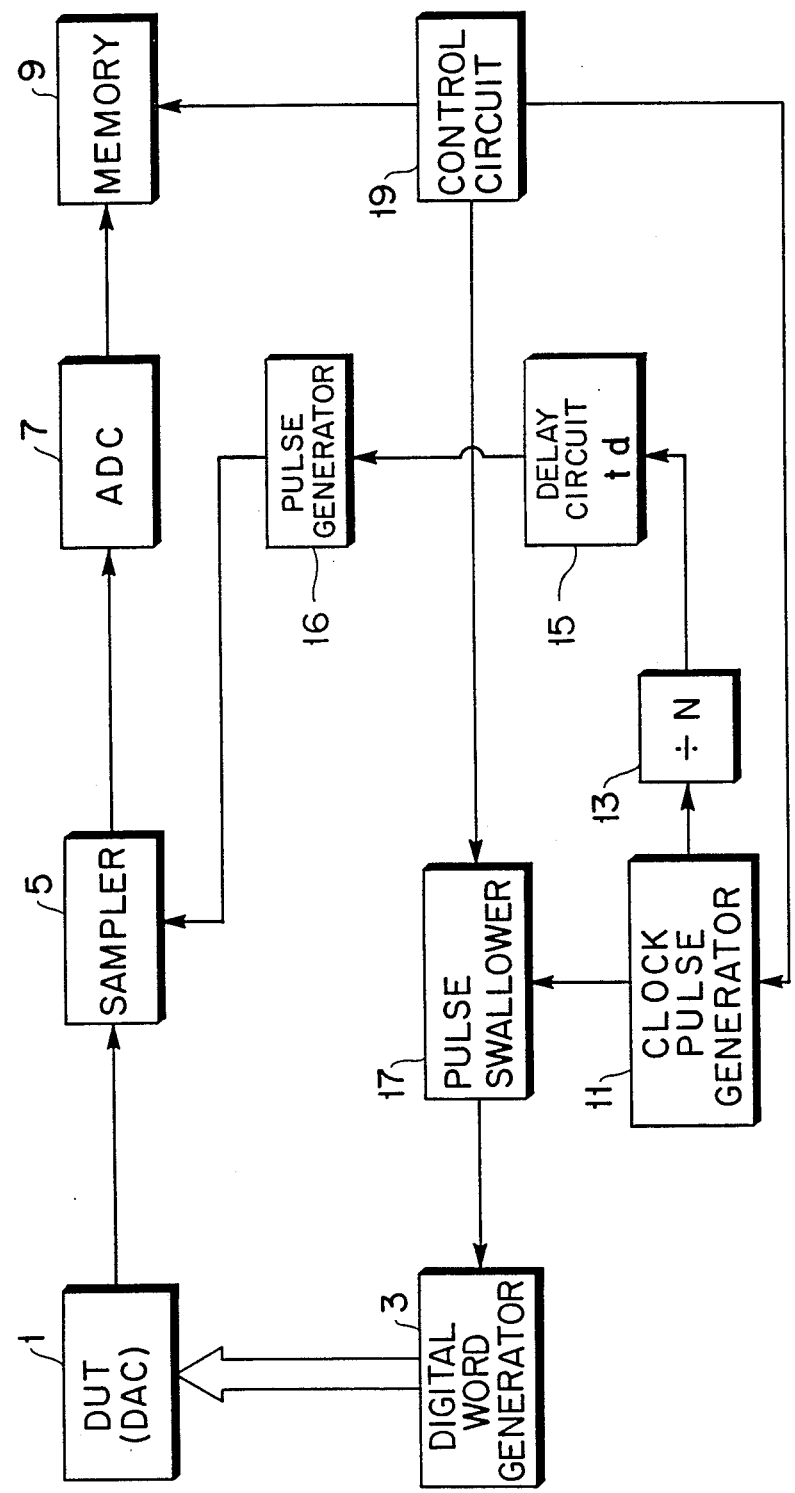
FIG. 1 is a schematic block diagram of a DAC measurement device constructed in accordance with the teachings of the invention.
Figure 2:
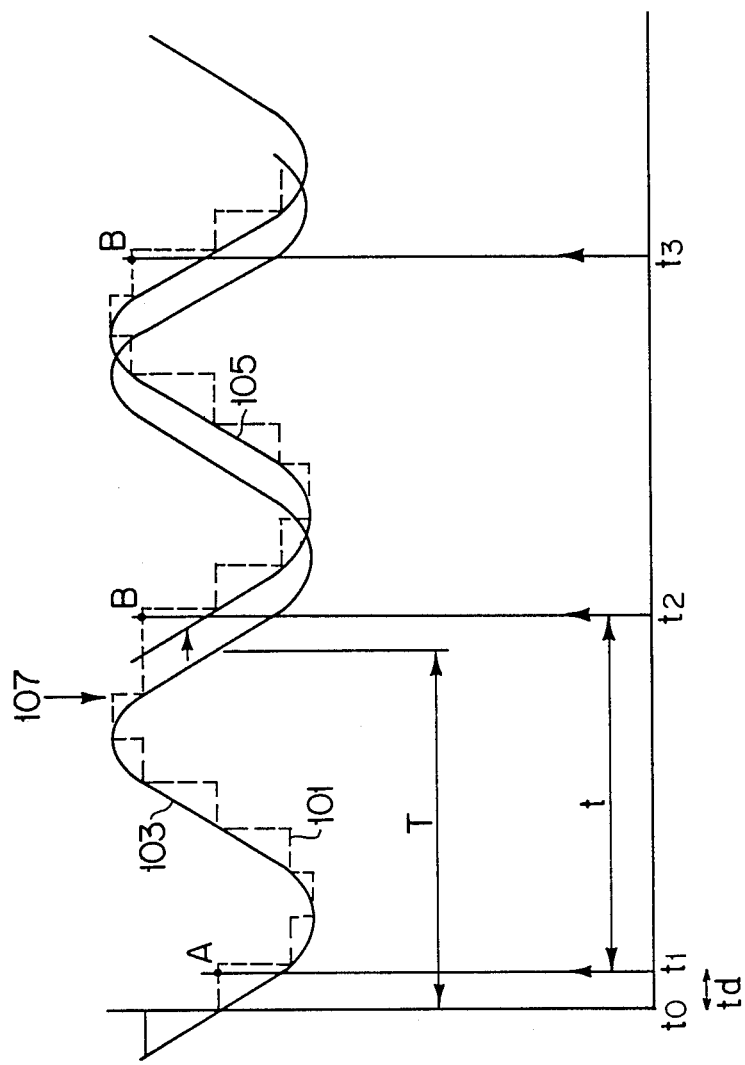
FIG. 2 is a diagram of waveforms which illustrate the operation of the device of FIG. 1 in making a measurement.

FIG. 1 shows the preferred embodiment of the DAC measurement circuit of this invention. FIG. 2 illustrates the operation of the circuit shown in FIG. 1 in making a measurement. The device under test, DAC 1 (e.g. 8 bit or 16 bit) receives data words from a digital word generator 3 and converts the digital input to an analog output signal, staircase waveform 101 in FIG. 2. Digital word generator 3 produces data words which correspond to a pseudo-sine wave having period T, so that the output of DAC is also in the form of a pseudo-sine wave of period T. Signal 101 is then reconverted into digital data by an analog-digital converter (ADC) 7 and is stored in a memory 9. A sample pulse generator 16 actuates sampler 5 under control by signals produced by a clock pulse generator 11, as modified by a frequency divider 13 (which may not be included) and a delay circuit 15. Delay circuit 15 introduces a delay time td so that sampling occurs after the output signal of DAC 1 is stabilized.

The digital word generator 3 is also controlled by the signals produced by clock pulse generator 11, as modified by a pulse swallower 17. The signal from clock pulse generator can either be applied directly to digital word generator 3, or pulse swallower 17 can eliminate a selected number of pulses from the pulse stream. A pulse swallower suitable for use in the invention is described in laid-open Japanese Patent No. 54(1979)-72657 assigned to Yokogawa-Hewlett-Packard Ltd.

A control circuit 19 controls the timing of the entire measurement operation by giving commands to clock pulse generator 11 and pulse swallower 17, as well as to memory 9 to store the output data of ADC 7.

The operation of the circuit of FIG. 1 in making a measurement will now be described, with reference to the waveforms of FIG. 2. The analog output of the DAC 1 is the stairstep waveform 101 that follows the continuous pseudo-sine wave signal 103. The period of signal 103 is T and an integral number of digital words make up each period. On each clock pulse from clock pulse generator 11, a new input word is produced by digital word generator 13. Frequency divider 13 divides by n so that sample pulse generator 16 triggers sampler 5 once each cycle of signal 103, i.e., with period t equal to T. Delay circuit 15 delays the signal to sample pulse generator 16 by td so that sampling occurs at time t1, point A, after the DAC output is stabilized. Additional sampling at point A on succeeding cycles can be done, at times t2 and t3 for example. Thus, the amplitude of the signal at point A can be repeatedly measured, to improve the accuracy of the output of ADC 7 by averaging multiple data measurements.

To move to the next digital word to be tested, one pulse is eliminated from the pulse stream from clock pulse generator 11 by pulse swallower 17. FIG. 2 shows the effect of swallowing one pulse at point 107. This delays the timing of digital word generator 3 by one word, effectively phase shifting the pseudo-sine wave so that the stairstep output signal 101 of DAC 1 begins to follow shifted pseudo-sine wave signal 105. Because the timing of the sampling trigger is not affected, the shift causes the sampling to occur one word earlier in the cycle, at point B. Sampler 5 will accordingly obtain the amplitude at point B in succeeding cycles at t2, t3, . . . , and these values can be averaged to obtain the measurement for point B. Pulse swallower 17 successively eliminates additional pulses to sample other steps of the output signal 101 of DAC 1 until a full cycle has been completed.

If a very accurate sampler is used, the number of data points taken may be reduced or averaging may not be necessary, and thus measurement time can be shortened.

Thus, in accordance with present invention, the output signal of DAC 1 is shifted by using pulse swallower 17 instead of delaying sampling by varying the delay time td to measure the amplitude at each step of the output signal of DAC 1. This eliminates the need for a programmable delay line, making the circuit much less expensive. Also, since the shifting operation of the invention can be accurately and simply controlled, the amplitude measurements can be made at the desired sampling points while the DAC under test operates at a high converting rate. Furthermore, using this procedure, it is easy to determine the location of errors in the output signal of the DAC by monitoring the corresponding digital input words.

I claim :

1. Apparatus for measuring characteristics of a digital to analog converter (DAC) by measuring a periodic analog output signal produced by the DAC in response to a sequence of a digital input words while the DAC is operating at a high converting rate, comprising:

clock pulse generating means;

a digital word generator, triggered by the clock pulses, for providing a periodic sequence of digital input words to the DAC;

sampling means, responsive to the clock pulses, for sampling the periodic analog output signal from the DAC at a sampling point having a constant delay time with respect to the triggering time of the digital word generator, to produce sampled analog values; and pulse swallowing means, connected between the clock pulse generating means and the digital word generator, for selectively eliminating clock pulses to shift the sampling point from the analog output corresponding to one digital input word to the analog output corresponding to a different digital input word from the DAC, without altering the delay time of the sampling point with respect to the triggering time of the digital word generator.

2. The device of claim 1 further comprising:

analog to digital converter means connected to the sampling means, for reconverting the sampled analog values to digital values; and memory for storing the reconverted digital values.

3. The device of claim 1 wherein the digital word generator advances one digital word in the periodic sequence for each clock pulse, and the pulse swallowing means eliminates one clock pulse to shift the sampling point from the analog output corresponding to one digital input word to the analog output corresponding to the next digital input word in the periodic sequence.

4. The device of claim 1 wherein the sampling means comprises:

a sampler triggerred by sampling pulses to sample the amplitude of the analog output signal of the DAC;

a frequency divider responsive to the clock pulses generated by the clock pulse generating means to produce a series of timing pulses having the frequency of the periodic sequence of digital input words;

a delay circuit responsive to the series of timing pulses to delay the pulses with respect to the clock pulses, by an interval equal to the settling time of the DAC; and a sampling pulse generator responsive to the delayed series of timing pulses, to produce the sampling pulses for triggering the sampler.

* * * * *